(12) United States Patent
Palacios Laloy et al.

(10) Patent No.: US 11,054,489 B2
(45) Date of Patent: Jul. 6, 2021

(54) VECTOR MAGNETOMETER IN ALIGNMENT WITH TWO DIFFERENTLY POLARISED PROBE BEAMS

(71) Applicant: COMMISSARIAT À L'ÉNERGIE ATOMIQUE ET AUX ÉNERGIES ALTERNATIVES, Paris (FR)

(72) Inventors: Augustin Palacios Laloy, Grenoble (FR); François Beato, Grenoble (FR); Gaëtan Lieb, Grenoble (FR)

(73) Assignee: COMMISSARIAT À L'ÉNERGIE ATOMIQUE ET AUX ÉNERGIES ALTERNATIVES, Paris (FR)

(*) Notice: Subject to any disclaimer, the term of this patent is extended or adjusted under 35 U.S.C. 154(b) by 21 days.

(21) Appl. No.: 16/511,298

(22) Filed: Jul. 15, 2019

(65) Prior Publication Data
US 2020/0018802 A1 Jan. 16, 2020

(30) Foreign Application Priority Data
Jul. 16, 2018 (FR) ...................................... 1856554

(51) Int. Cl.
G01R 33/032 (2006.01)
(52) U.S. Cl.
CPC .................. G01R 33/032 (2013.01)
(58) Field of Classification Search
None
See application file for complete search history.

(56) References Cited

U.S. PATENT DOCUMENTS

| | | | | |
|---|---|---|---|---|
| 5,254,947 A | * | 10/1993 | Chaillout | G01R 33/26 324/304 |
| 2016/0084925 A1 | * | 3/2016 | Le Prado | A61B 5/04008 324/301 |
| 2018/0164102 A1 | | 6/2018 | Morales et al. | |
| 2019/0003833 A1 | | 1/2019 | Palacios Laloy | |
| 2019/0074660 A1 | | 3/2019 | Beato et al. | |

(Continued)

FOREIGN PATENT DOCUMENTS

FR 2663432 A1 12/1991

OTHER PUBLICATIONS

U.S. Appl. No. 16/272,103, entitled Vector Magnetometer With Elliptical Polarisation, filed Feb. 11, 2019.

(Continued)

Primary Examiner — Jas A Sanghera
(74) Attorney, Agent, or Firm — Pearne & Gordon LLP

(57) ABSTRACT

A vector magnetometer comprises a cell to be filled with an atomic gas, an optical source and a photo-detection device. The optical source is configured to emit towards the cell: a first and a second optical beam, called probe beams, that are polarised linearly, a third optical beam, called the pump beam, linearly polarised. The polarisation directions of the probe beams and the polarisation direction of the pump beam are not coplanar. The photo-detection device is configured to receive light from the probe beams that have passed through the cell. The probe beams can have the same propagation direction. The polarisation direction of the pump beam can form an angle of 45°±10° with the polarisation direction of each of the probe beams.

11 Claims, 3 Drawing Sheets

(56) References Cited

U.S. PATENT DOCUMENTS

2019/0107395 A1    4/2019  Palacios Laloy et al.

OTHER PUBLICATIONS

Search Report for French Application No. FR1856554 dated May 24, 2019.
Patton, B. et al. "All-optical Vector Atomic Magnetometer";In: arxiv.org, Cornell University Library, Mar. 28, 2014, pp. 2-5.
Sun, Wei-Min et al., "All-Optical Vector Cesium Magnetometer" In: Chinese Physics Letters, 2017, vol. 34, No. 5, pp. 058501-1-058501-4.
Mizutani, Natsuhiko et al. "Magnetic Field Vector Detection in Frequency Domain with an Optically Pumped Atomic Magnetometer" In: IEEE Transactions on Magnetics, IEEE Service Center, Nov. 2012, pp. 4096-4099.
Seltzer, S. et al. "Unshielded three-axis vector operation of a spin-exchange-relaxation-free atomic magnetometer" In: Applied Physics Letters, A I P Publishing LLC, Nov. 16, 2004, vol. 85, No. 2, pp. 4804-4806.
J. Dupont-Roc. "Détermination par des méthodes optiques des trois composantes d'un champ magnètique très faible" In: Revue de Physique Appliquee, 1970, vol. 5, No. 6, pp. 853-864.
Allred, J.C. et al. "High-Sensitivity Atomic Magnetometer Unaffected by ~Spin-Exchange Relaxation" In: Physical-Review Letters, Sep. 23, 2002, vol. 89, No. 13, pp. 130801-1-130801-4.
Hecht, Eugene et al. , "Polarization" In: Optics, 2002, Chapter 8.

\* cited by examiner

VECTOR MAGNETOMETER IN ALIGNMENT WITH TWO DIFFERENTLY POLARISED PROBE BEAMS

CROSS-REFERENCE TO RELATED APPLICATIONS

This application claims priority from French Patent Application No. 1856554 filed on Jul. 16, 2018. The content of this application is incorporated herein by reference in its entirety.

TECHNICAL FIELD

The domain of the invention is magnetometers with optical pumping.

STATE OF PRIOR ART

Optical pumping magnetometers use atomic gases confined in a cell, typical metastable helium or alkaline gases, as sensitive elements. These magnetometers that can be in different configurations, can be used to determine the magnetic field making use of the following three processes that take place either sequentially or concomitantly:

1) The use of polarised light sources, typically lasers, provides a means of preparing atomic states characterised by a given orientation or alignment of their spins. This method is called "optical pumping" in the field.

2) These atomic states change under the effect of the magnetic field, particularly under the Zeeman effect, that corresponds to offsets of energy levels as a function of the magnetic field applied to the atoms.

3) The optical properties of the atomic medium are then changed depending on the state of the atoms. Thus, an optical measurement can be made, for example an optical absorption measurement, to determine the effective Zeeman offset and deduce a measurement of the magnetic field in which the cell is immersed.

Depending on the different possible configurations of existing optical pumping magnetometers, a distinction is made between a measurement of the modulus, also called the norm, of the magnetic field for scalar magnetometers, or a determination of the different components of the magnetic field for vector magnetometers, at the location of the cell.

The sensitivity level, also called low noise, and the accuracy that can be achieved with such optical pumping magnetometers, are very remarkable and significantly better that what is possible with other magnetic measurement technologies (fluxgate, Hall effect, magnetoresistance, etc.). The only magnetometer that has similar noise is the SQUID type magnetometer, but it requires cryogenic cooling of the sensitive element that contains elements that have to be superconducting for operation, which restricts its use in practice.

There are two well-known configurations for making a vector measurement of the magnetic field with a wide passband; the first is called the "Hanle effect" configuration and the second is called the "parametric resonance magnetometer". These configurations are described particularly in the paper by J. Dupont-Roc, "Dé termination par des mé thodes optiques des trois composantes d'un champ magnetique tres faible" (Determination of the three components of a very weak magnetic field by optical methods) Applied Physics review, vol. 5, No. 6, pp. 853-864, 1970. They function at very low values of the external magnetic field, inducing a weaker Zeeman offset than relaxation rates of Zeeman sub-levels of the atom, which for the case of helium fixes a limit of about 100 nano Tesla, which is 500 times less intense than the earth's magnetic field.

When a weak static transverse magnetic field sweeping around zero is applied to the cell, the atoms are affected by a precession movement and the number of absorbed photons from the optical pumping laser is subject to resonant variations (Hanle effect). Analogue resonances, called parametric resonances, are observed when a radio frequency field is applied. Under these conditions, the magnetic moment of each atom is affected by resonant oscillations at frequencies that are multiples of the frequency of the radio frequency field. A measurement of the amplitude of these oscillations can be used to determine the modulus of the component of the magnetic field colinear with the radio frequency field.

Nevertheless, the Hanle effect magnetometer has the disadvantages of being sensitive to low frequency noise of the probe laser and to use at least two optical accesses orthogonal to the measurement cell, which makes it large and complex to make. Such a magnetometer based on pumping in circular polarisation, is described for example in J. C. Allred, R. N. Lyman, T. W. Kornack, and M. V. Romalis, "High-Sensitivity Atomic Magnetometer Unaffected by Spin-Exchange Relaxation," Phys. Rev. Lett., vol. 89, No. 13, p. 130801, September 2002.

Although the parametric resonance magnetometer can avoid feedback of noise typically present around the zero frequency using the radio frequency field(s) used to modulate the frequencies of the magnetic resonances and to make measurements along several sensitive axes using two radio frequency fields, it has the following disadvantages:

Its signal level is degraded due to the presence of the RF field(s), the signal amplitudes being multiplied by combinations of Bessel functions of the first kind less than 1;

When the magnetometer is placed with other magnetometers of the same type to form a network (for example for magnetic imagery), the radio frequency fields of each magnetometer that are created by coils around the sensitive element can affect adjacent magnetometers by means of residual coupling that in particular can modify the measurement direction of these adjacent magnetometers.

PRESENTATION OF THE INVENTION

In general, we would like to have a magnetometer with the largest possible signal-to-noise ratio. This is the case particularly in magnetometer applications in which the magnetic field measurement is used to deduce the position of field sources (currents or magnetic materials) and in which a low signal-to-noise ratio can induce large uncertainties on the magnitudes or positions of these sources.

To achieve this, the invention proposes a vector magnetometer comprising a cell that is to be filled with an atomic gas, an optical source and a photo-detection device. The optical source is configured to emit a first and a second optical beam, called probe beams, in the direction of the cell, that are linearly polarised, and a third optical beam, called pump beam, that is at least partially linearly polarised. The polarisation directions of the probe beams and the polarisation direction of the pump beam are not coplanar. The photo-detection device is configured to receive light from the probe beams that have passed through the cell.

As a result, the invention discloses a Hanle effect magnetometer that is not very sensitive to low frequency noise and that has two or even three sensitive axes without being subjected to the disadvantages introduced by the radio frequency field(s) for parametric resonance excitation.

Some preferred but non-limitative aspects of this magnetometer are as follows:
- the optical source is configured so that the probe beams are propagated along the same propagation direction and are modulated differently, the photo-detection device comprising a photodetector arranged to receive light that passed through the cell in the propagation direction of the probe beams;
- the probe beams are modulated at different frequencies;
- the probe beams are modulated at the same frequency with phases in quadrature;
- the probe beams are modulated in amplitude or in polarisation;
- the polarisation direction of the pump beam forms an angle of 45°±10° with the polarisation direction of each of the probe beams;
- the propagation direction of the probe beams is along the Ox axis of an Oxyz orthonormal coordinate system, the first optical beam has a polarisation direction along the Oy axis of the orthonormal coordinate system and the second optical beam has a polarisation direction that forms an angle of 60° with the polarisation direction of the first optical beam;
- the propagation direction of the pump beam forms an angle with the propagation direction of the probe beams that is between 35.3° and 70°, preferably between 35.3° and 45°;
- the optical source is configured to emit a fourth optical beam towards the cell, with a linear polarisation that forms an angle of 45°±10° with the propagation direction of the pump beam and an angle of 90° with the polarisation direction of the pump beam.

The invention also relates to a method of measuring a magnetic field using such a magnetometer.

BRIEF DESCRIPTION OF THE DRAWINGS

Other aspects, purposes, advantages and characteristics of the invention will be better understood after reading the detailed description given below of preferred embodiments of the invention, given as non-limitative examples, with reference to the appended drawings on which.

DETAILED PRESENTATION OF PARTICULAR EMBODIMENTS

Figure 1:
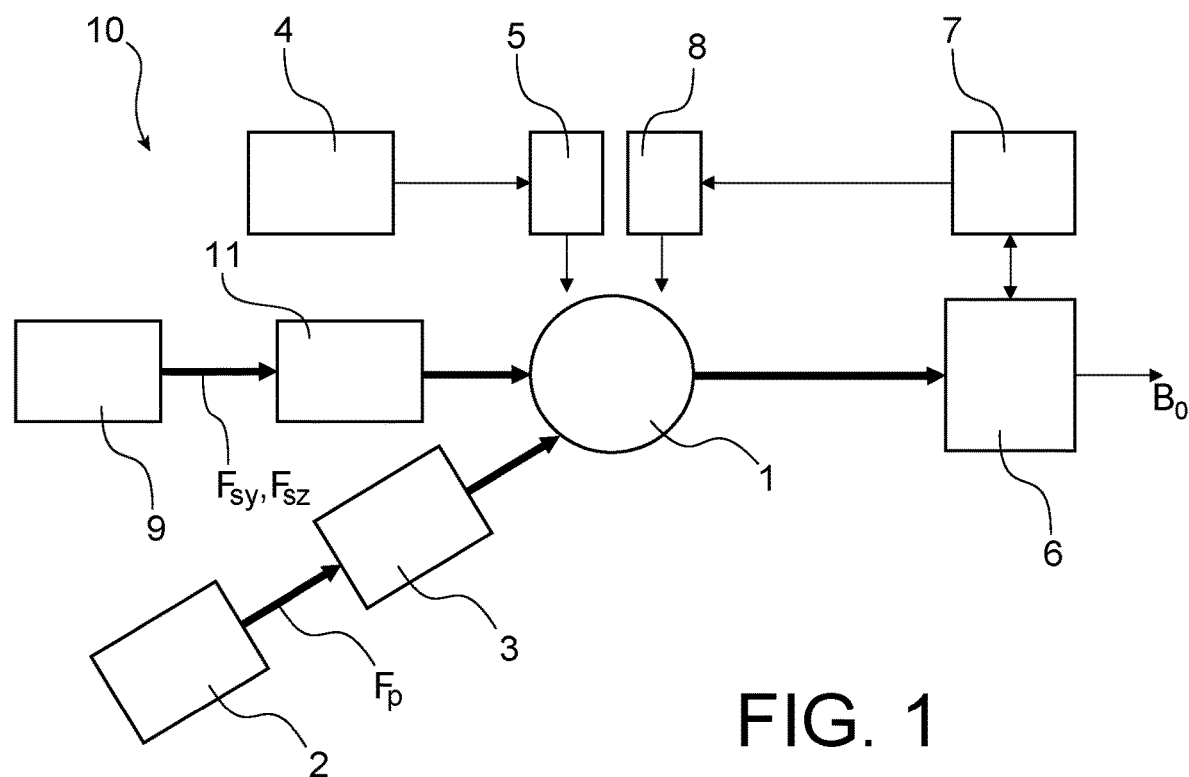
FIG. 1 is a diagram of a magnetometer according to the invention.

With reference to FIG. 1, the invention relates to an optical pumping vector magnetometer 10 that comprises a cell 1 filled with an atomic gas that can be polarised in alignment, for example helium-4 or an alkaline gas, and that is subjected to an ambient magnetic field $B_0$.

The cell is illuminated by an optical source that in particular comprises a pumping element 2 capable of emitting a light beam Fp, for example a laser beam, towards the cell 1, tuned to a pumping wavelength (this beam is thus also referred to as the pump beam in the following). The pumping wavelength is fixed on an atomic transition line, for example on the $D_0$ line at 1083 nm in the case of helium-4.

In the case in which the sensitive element is helium-4, the magnetometer 10 also comprises a high frequency (HF) discharge system comprising an HF generator 4 and overvoltage coils 5, to bring the atoms of atomic gas into an energised state in which they can be subjected to an atomic transition when they are illuminated by the pump beam Fp, typically in the metastable state $2^3S_1$.

The pump beam Fp is polarised by means of a polarisation device 3 intercalated between the pumping element 2 and the cell 1 or directly integrated into the pumping element 2. In the framework of the invention, the pump beam Fp is partially or totally linearly polarised, which induces "aligned" atomic states in the cell 1, the alignment axis being fixed by the direction of the electric field of the light used for pumping. Partially polarised means that the pump beam Fp is partially linearly polarised and partially depolarised, its Stokes parameters then being such that S1+S2+S3<S0 as presented in Chapter 8 of the "Optics" book by Eugene Hecht, Addison Wesley 2002.

The magnetometer also comprises a photo-detection device 6 that receives light that passed through the cell and outputs a signal carrying information about the alignment state of the atoms of the atomic gas in the cell to an electronic processing unit that makes use of this signal to output a measurement of the ambient field $B_0$.

The magnetometer may also comprise a closed loop slaving system of the magnetometer so that a zero total magnetic field is continuously applied to the sensitive element. The slaving system comprises a regulator 7 coupled to the processing electronics and that injects a current into Helmholtz coils 8 with orthogonal axes that surround the cell 1 so as to generate a magnetic compensation field Bc such that the sum $Bc+B_0$ is kept equal to zero at all times.

Alternatively, the magnetometer can be operated in open loop, without compensation of the ambient field.

The magnetometer can also be placed inside a magnetic shielding that assures that the earth's field and other magnetic disturbances are absent in its interior. Shielding with several layers of ferromagnetic materials such as mu-metal can assure that residual field levels inside the shielding are less than about a hundred nano Tesla.

In the framework of the invention, the pump beam Fp is not used for detection of the state of alignment of the atoms of the atomic gas in the cell. This detection is made by having the optical source to also comprise a probing element 9 capable of emitting two or even three light beams Fsy, Fsz, for example laser beams, towards the cell 1, that are also tuned to the target atomic transition line and are called probe beams.

An independent laser can be used for each of the pump and probe beams. In one variant embodiment, a single laser can be used associated with a three channels optical divider into (one pump and two probe) or a four channels optical divider when a third probe beam is used.

As shown on FIG. 1, these beams Fsy, Fsz, called probe beams in the following, are polarised linearly by means of a polarisation device 11 intercalated between the probing element 9 and the cell or directly integrated into the probing element 9.

Polarisation directions of the two probe beams and the polarisation direction of the pump beam are not coplanar such that the magnetometer can deduce different components of the magnetic field. The magnetometer thus has a first sensitive axis normal to the plane defined by the polarisation direction of the first probe beam and the polarisation direction of the pump beam, and a second sensitive axis normal to the plane defined by the polarisation direction of the second probe beam and the polarisation direction of the pump beam.

The orientation of the linear polarisation of each of the probe beams can be optimised as will be described later in order to make the magnetometer sensitive to components of the magnetic field $B_0$ independent of each other (the projection of one onto the other is zero) while maximising this sensitivity.

If the probe beams Fsy, Fsz do not propagate along the same propagation direction, the photo-detection device can comprise two photodetectors, each arranged to receive light having passed through the cell in the propagation direction of one of the probe beams.

Figure 4:
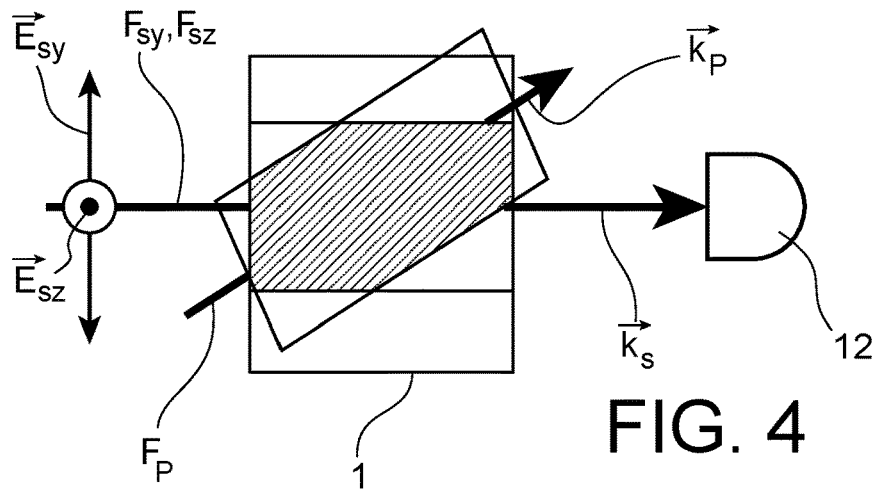
FIG. 4 is a diagram illustrating one possible propagation of pump and probe beams in a magnetometer according to the invention.

In one embodiment represented on FIG. 4, the probe beams Fsy, Fsz propagate along the same propagation direction $\vec{k}_s$ so as to reduce the number of optical accesses to the cell 1. The photo-detection device may then comprise only a single photodetector 12 arranged to receive light that has passed through the cell in the propagation direction $\vec{k}_s$ of the probe beams Fsy, Fsz. Since the propagation of a beam is orthogonal to its polarisation, the polarisation direction $\vec{E}_{sy}$, $\vec{E}_{sz}$ of each of the probe beams is orthogonal to the common propagation direction $\vec{k}_s$ as represented on FIG. 4.

In such a case, the probe beams are modulated differently to enable the processing electronics to separate information carried by each of these beams after passing through the cell 1. The probe beams can be modulated in amplitude, in polarisation, or even in wavelength in a degraded amplitude modulation implementation mode. The modulation frequency can be sufficiently high for example of the order of 30 kHz, to overcome low frequency noise problems of the laser or lasers supplying the probe beams, without losing signal amplitude unlike a parametric resonance magnetometer. Therefore the magnetometer according to the invention makes a Hanle effect magnetometer with low sensitivity to noise and that has (at least) two sensitive axes, these benefits being achieved without introducing any problems related to the use of RF fields in the parametric resonance magnetometers.

The probe beams can be modulated at different frequencies, or modulated at the same frequency but with phases in quadrature (in other words with phases at 90° from each other).

Optical beams emitted by the optical source can be produced by lasers, for example semiconducting diodes. The two probe beams can for example be amplitude modulated at modulation frequencies of 17 kHz and 26 kHz respectively. This modulation may for example be made using a photo-acoustic modulator or a liquid crystal modulator for which the limited passband is sufficient for modulation up to about ten kHz. Each photodetector may be a photodiode, for example an InGaAs photodiode particularly sensitive in the near infrared, domain in which the light of probe beams is located. The photodiode is connected to a transimpedance amplifier at the output of which there is a signal with two frequency components, one at 17 kHz and the other at 26 kHz for example, each associated with one of the probe beams.

Figure 2A:
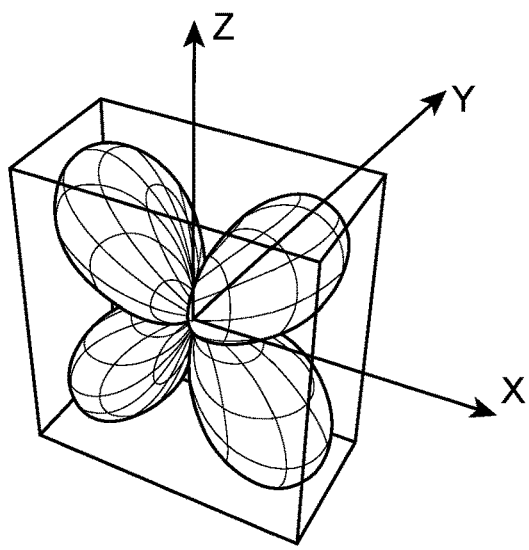
FIGS. 2a and 2b illustrate the sensitivity of a probe beam to different components of the ambient magnetic field as a function of the polarisation direction of the probe beam.
Figure 2B:
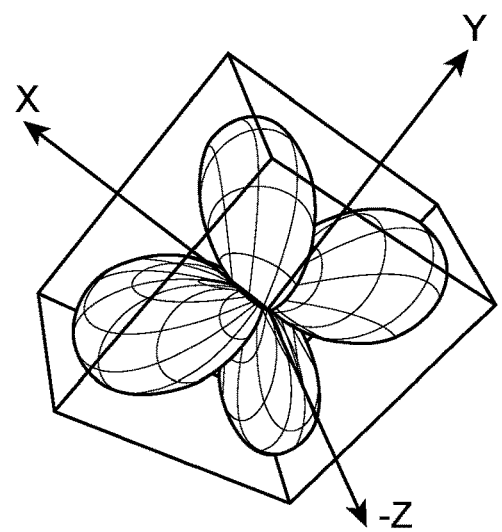
Figure 2C:
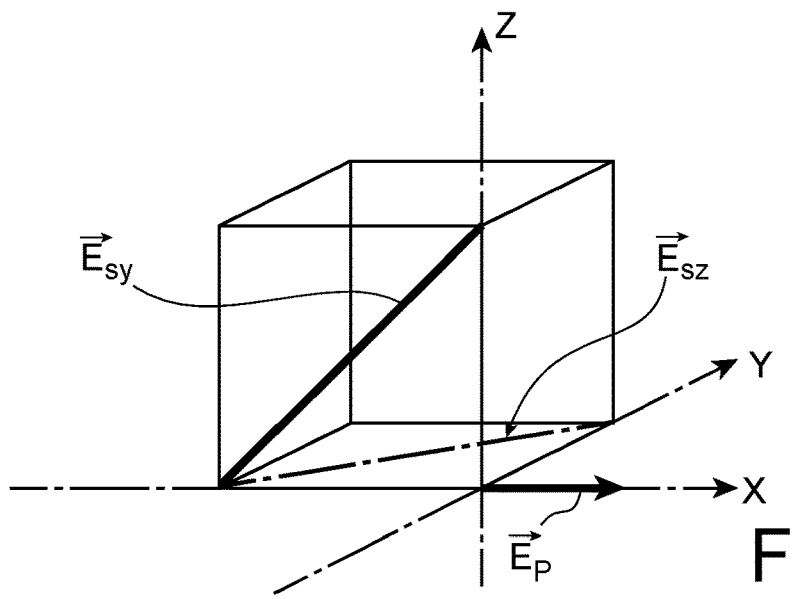
FIG. 2c and FIG. 3 represent optimum polarisation directions of probe beams in two different coordinate systems.

Projection of the ambient magnetic field $B_0$ on three rectangular coordinate axes defines three components of the field. With reference to FIGS. 2a-2c, a reference coordinate system XYZ is chosen in which the X axis is in line with the polarisation direction $\vec{E}_p$ of the pump beam. The ambient magnetic field $B_0$ is thus composed of three components $B_X$, $B_Y$ and $B_Z$, each along one of the measurement axes X, Y and Z of the magnetometer.

In one embodiment of the invention, the magnetometer uses optimum Y probe and Z probe beams for the probe beams, described below, or at least beams close to being optimal, Y' probe and Z' probe, for which the polarisation directions are at an angular offset of +/−10° respectively from the polarisation direction of the corresponding optimum Y probe beam and Z probe beam.

FIG. 2a shows the sensitivity of a probe beam to the magnetic field $B_Y$ along the Y axis as a function of the polarisation direction of the probe beam. It is deduced that the polarisation that can be used to measure the field $B_Y$ with an optimum signal level is the polarisation that forms an angle of 45° with the X axis and 90° with the Y axis. A beam probe polarised in this way is designated in the following by the term Y probe.

FIG. 2b illustrates the sensitivity of a probe beam to the magnetic field $B_Z$ along the Z axis as a function of the polarisation direction of the probe beam. It is deduced that the polarisation that can be used to measure the field $B_Z$ with an optimum signal level is the polarisation that forms an angle of 45° with the X axis and 90° with the Z axis. A beam probe polarised in this way is designated in the following by the term Z probe.

FIG. 2c represents examples of such optimum polarisations, along the $\vec{E}_{sy}$ direction for the Y probe and along the $\vec{E}_{sz}$ direction for the Z probe, in the XYZ coordinate system.

Figure 3:
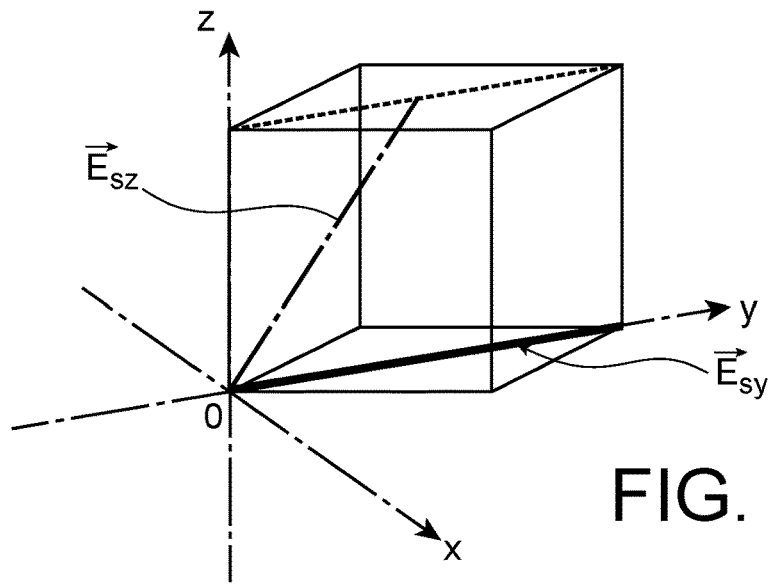

In the following, different directions are associated with the corresponding unit vectors in an Oxyz orthonormal coordinate system represented in FIG. 3, of which the Ox axis of unit vector $\vec{x}$ is aligned along the propagation direction of a first optical probe beam that is linearly polarised along the Oy axis of this coordinate system. In fact, this is the Y probe for which the polarisation direction $\vec{E}_{sy}=\vec{y}$ is along the Oy axis with unit vector $\vec{y}$ and for which the propagation direction $\vec{k}_{sy}=\vec{x}$ is along the Ox axis.

The second optical probe beam, in fact the Z probe, is along the same propagation direction $\vec{k}_{sz}=\vec{x}$ and its polarisation direction $\vec{E}_{sz}$ in the Oyz plane that forms an angle of 60° with the polarisation direction $\vec{E}_{sy}$ of the Y probe, namely $$\vec{E}_{sy} = \frac{1}{2}\vec{y} + \frac{\sqrt{3}}{2}\vec{z}.$$

The pump beam Fp propagates along a direction $\vec{k}_p$ forming a non-zero angle with the propagation direction $\vec{k}_{sy}=\vec{k}_{sy}=\vec{x}$ of the probe beams. In one advantageous embodiment represented on FIG. 4, the pump beam Fp enters the cell 1 through the same optical face as the face through which the probe beams Fsy, Fsz enter, which simplifies implementation. The optimum propagation direction of the pump beam to obtain this effect (in the sense that the three optical beams are closer to each other on the optical inlet face, maximise the useful measurement zone and reduce the size) is the direction in which it is at an angle of a cos $$\left(\frac{2}{\sqrt{3}}\right),$$

namely about 35.3°, with the propagation direction of the probe beams, this angle being measured in the plane orthogonal to the polarisation axis X of the pump beam. A value of between 35.3° and 90° is then adopted for this angle, preferably an angle between 35.3° and 70°, and even more preferably a value between 35.3° and 45°.

Figure 5:
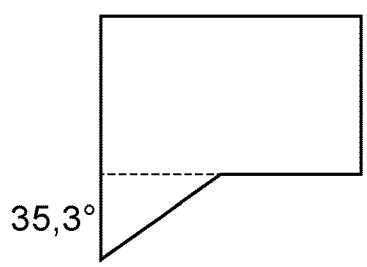
FIG. 5 is a diagram of a cell with optimised volume that can be used in a magnetometer according to the invention.

On this FIG. 4, the cross-hatched zone represents the useful measurement zone in the cell, corresponding to the intersection of rectangles symbolising the width of the probe beams and the width of the pump beam respectively. FIG. 5 represents a cell with optimised volume from which all parts not useful for the measurement have been removed. This cell has an "ear" providing access to the pump beam at an optimum angle of 35.3°.

As seen previously, the polarisation direction of the pump beam $\vec{E}_p$ is such that it forms an angle of 45° with the polarisation direction $\vec{E}_{sy}$ of the Y probe and an angle of 45° with the polarisation direction $\vec{E}_{sz}$ of the Z probe.

The following analytical formulas are deduced from this:

$$\vec{k_p} = -\sqrt{\frac{2}{3}}\vec{x} + \frac{1}{2}\vec{y} + \frac{1}{2\sqrt{3}}\vec{z} \text{ and } \vec{E_p} = \frac{1}{\sqrt{3}}\vec{x} + \frac{1}{\sqrt{2}}\vec{y} + \frac{1}{\sqrt{6}}\vec{z}$$

By using the beams with the optimum directions discussed above and using the example of probe beams modulated at different frequencies and a magnetometer not operated at zero field, there are two frequency components at the output from the amplifier to which the photodiode 12 is connected, for example with one at 17 kHz that in a field range of a few tens of nT around zero field is directly proportional to the $B_Y$ field along the Y axis, and the other, for example at 26 kHz, that in a field range of a few tens of nT around zero field is directly proportional to the $B_Z$ field along the Z axis.

These sensitivity axes Y and Z of the magnetometer are defined as follows in the Oxyz coordinate system. The Y axis is orthogonal to the polarisation direction of the pump beam and to the direction of the Oy axis (polarisation direction of the Y probe). The Z axis is orthogonal to the polarisation direction of the pump beam and to the polarisation direction of the Z probe. We can deduce $$\vec{Y} = -\frac{1}{\sqrt{3}}\vec{x} + \sqrt{\frac{2}{3}}\vec{z} \text{ and } \vec{Z} = -\frac{1}{\sqrt{3}}\vec{x} + \frac{1}{\sqrt{2}}\vec{y} - \frac{1}{\sqrt{6}}\vec{z}$$

We have seen in the above that the magnetometer according to the invention has two sensitive axes. In one variant embodiment, a measurement of the ambient magnetic field can be made by adopting a partially polarised pump beam. The optical source can then be configured to emit a fourth optical beam towards the cell, namely a third probe beam that optimally has linear polarisation that forms an angle of 45° with the propagation direction of the pump beam and an angle of 90° with the polarisation direction of the pump beam. The four optical beams can be injected into the cell from a single optical access. The first two probe beams, the Y probe and the Z probe, have the same propagation direction. Propagation of the pump beam can in particular form an angle of 35.3° with the propagation direction of the first two probe beams, this angle being measured in the plane that contains the two propagation directions defining the XZ plane. Propagation of the third probe beam can also form an angle of 35.3° with the propagation direction of the first two probe beams, this angle being measured in the plane that contains the two propagation directions, that will be chosen to be the YZ or the XY plane. The magnetometer comprises a photodetector on which the third probe beam is incident after having passed through the cell. This photodetector outputs a signal representative of the component of the ambient magnetic field along the X axis. Like the Y probe and Z probe beams, the third probe beam can be modulated.

The invention also relates to a method of measuring a magnetic field using a vector magnetometer as described above. In particular, this method includes emission of the following towards the cell:
  a first and second optical beam called probe beams, that are linearly polarised with different polarisation directions,
  a third optical beam called the pump beam, entirely or partially linearly polarised,
  said emission being made such that the polarisation directions of the probe beams and the polarisation direction of the pump beam are not in the same plane.
and detection of light from the probe beams that have passed through the cell.

The invention claimed is:

1. A vector magnetometer comprising a cell (1) to be filled by an atomic gas, a photodetection device and an optical source configured to emit towards the cell:
  a pump beam at least partially linearly polarised,
  a first probe, and
  a second probe beam,
wherein the first and second probe beams are polarised linearly, wherein the polarisation directions of the first and second probe beams and the polarisation direction of the pump beam are not coplanar and wherein the photo-detection device (6) is configured to receive light (L) from the first and second probe beams that have passed through the cell.

2. The vector magnetometer according to claim 1, wherein the optical source is configured so that the first and second probe beams propagate along the same propagation direction and are modulated differently, and wherein the photo-detection device comprises a photodetector arranged to receive light that passed through the cell in the propagation direction of the first and second probe beams.

3. The vector magnetometer according to claim 2, wherein the first and second probe beams are modulated at different frequencies.

4. The vector magnetometer according to claim 2, wherein the first and second probe beams are modulated at the same frequency with phases in quadrature.

5. The vector magnetometer according to claim 2, wherein the first and second probe beams are modulated in amplitude or in polarisation.

6. The vector magnetometer according to claim 2, wherein the polarisation direction of the pump beam forms an angle of 45°±10° with the polarisation direction of each of the first and second probe beams.

7. The vector magnetometer according to claim 6, wherein the propagation direction of the first and second probe beams is along the Ox axis of an Oxyz orthonormal coordinate system, the first probe beam has a polarisation direction along the Oy axis of the orthonormal coordinate system and the second probe beam has a polarisation direction that forms an angle of 60° with the polarisation direction of the first probe beam.

8. The vector magnetometer according to claim 2, wherein the propagation direction of the pump beam forms an angle with the propagation direction of the first and second probe beams that is between 35.3° and 70°, preferably between 35.3° and 45°.

9. The vector magnetometer according to claim 1, wherein the optical source is configured to emit a fourth optical beam towards the cell, with a linear polarisation that forms an angle of 45°±10° with the propagation direction of the pump beam and an angle of 90° with the polarisation direction of the pump beam.

10. The vector magnetometer according to claim 1, further comprising a closed loop slaving system of the vector magnetometer to make it operate in zero field.

11. A method of measuring a magnetic field using a vector magnetometer comprising a cell filled with an atomic gas subject to an ambient magnetic field, an optical source and a photodetection device, the method comprising:

emission by the optical source towards the cell, of:
a first and a second probe beam,
a pump beam, entirely or partially linearly polarised,
said emission being made such that the first and second probe beams are polarised linearly and that the polarisation directions of the first and second probe beams and the polarisation direction of the pump beam are not coplanar; and use of the photodetection device to detect light from the first and second probe beams that have passed through the cell.

* * * * *